United States Patent [19]

Tazartes et al.

[11] Patent Number: 5,521,555
[45] Date of Patent: May 28, 1996

[54] ULTRA LOW NOISE OPTICAL RECEIVER

[75] Inventors: Daniel A. Tazartes, West Hills; John E. Higbee, Simi Valley; Jacque A. Tazartes, Beverly Hills; Juergen K. P. Flamm, Tarzana; John G. Mark, Pasadena, all of Calif.

[73] Assignee: Litton Systems, Inc., Woodland Hills, Calif.

[21] Appl. No.: 279,509

[22] Filed: Jul. 25, 1994

[51] Int. Cl.$^6$ ............................................. H03F 3/08
[52] U.S. Cl. .................. 330/308; 250/214 A; 330/156; 330/300
[58] Field of Search .................. 330/59, 156, 300, 330/308; 250/214 A; 359/189

[56] References Cited

U.S. PATENT DOCUMENTS

| | | | |
|---|---|---|---|
| 4,647,762 | 3/1987 | Chown | 250/214 A |
| 4,761,549 | 8/1988 | Mealer, III et al. | 330/308 X |
| 5,130,526 | 7/1992 | Mischel et al. | 250/214 A X |
| 5,216,386 | 6/1993 | Wyatt | 330/300 X |
| 5,343,164 | 8/1994 | Holmdahl | 330/300 X |

FOREIGN PATENT DOCUMENTS

| | | | |
|---|---|---|---|
| 191506 | 8/1989 | Japan | 330/308 |

OTHER PUBLICATIONS

Towers, "High Input–Impedance Amplifier Circuits", *Wireless World*, Jul. 1968, pp. 197–201.

*Primary Examiner*—James B. Mullins
*Attorney, Agent, or Firm*—Poms, Smith, Lande & Rose; John H. Lynn

[57] ABSTRACT

An amplifier topology for receiving signals output from a fiber optic rotation sensor and producing voltages that may be processed to determine the rotation rate includes a photodiode for receiving an optical signal and producing a corresponding electrical photodiode output signal. An ultra low noise and ultra low capacitance differential input stage is connected to receive the photodiode output signal. An operational amplifier having low noise and ultra-wide bandwidth is connected to the ultra low capacitance differential input stage to receive the output signal therefrom as a driving signal and to produce a low noise output signal. The differential input stage comprises a first amplifier circuit that includes a first transistor connected to the photodetector to act as a first buffer having low noise, low capacitance and unity gain. The first amplifier circuit also includes a second transistor configured as a first voltage follower connected between the output of the first buffer and the operational amplifier to isolate the output of the first buffer from parasitic capacitive loading from a biasing network. The differential input stage further comprises a second a second amplifier circuit that includes a third transistor having an input connected to a reference potential, the third transistor acting as a second buffer having low noise, low capacitance and unity gain. The second amplifier circuit also includes a fourth transistor configured as a second voltage follower connected between the output of the second buffer and the operational amplifier.

19 Claims, 2 Drawing Sheets

ULTRA LOW NOISE OPTICAL RECEIVER

BACKGROUND OF THE INVENTION

This invention relates generally to apparatus and methods for amplifying low level electrical signals for subsequent processing. This invention relates particularly to apparatus and methods for amplifying electrical signals output from a photodetector. Still more particularly, this invention relates to apparatus and methods for amplifying signals output from a photodetector to indicate variations in the interference pattern formed between counterpropagating waves in an optical rotation sensor such as a fiber optic gyroscope.

A fiber optic rotation sensor uses the Sagnac effect in a coil of optical fiber to detect rotations about a sensing axis that is perpendicular to the plane of the coil. Counterpropagating light waves in the sensing coil experience a phase shift that is related to the rotation rate. The phase shift is seen as a change in the interference pattern formed by the waves when they are combined. The interference pattern is produced when two waves of the same polarization have traversed the fiber optic sensing coil in opposite directions and then interfere. The interference pattern may be monitored by directing it onto a photodetector, which produces an electrical signal indicative of the intensity of the light in the interference fringe pattern.

Due to limitations in light sources and optical losses in various components of the fiber optic rotation sensor, the sensitivity tends to be very small. An angular rate of 1°/hr, which is approximately one fifteenth of the earth's rotation rate, typically corresponds to 1 pW of intensity change. An important parameter in a fiber optic rotation sensor is its white noise, which causes random walk in the angle. For a 1°/hr fiber optic rotation sensor, typical requirements for random walk are on the order of $0.03°/\sqrt{hr}$ equivalently, $1.8°/\sqrt{Hz}$. Because the light source generates wideband noise, and shot noise is incurred at the detector, most of the noise allocation is already used up. It is a goal to achieve a noise contribution of less than $0.65°/\sqrt{Hz}$ from the transimpedance amplifier that converts the current output of the photodetector to a usable voltage for subsequent processing to determine the rotation rate. For photodetectors operating in the wavelength range employed by fiber optic rotation sensors, this noise requirement translates into approximately $0.6 pA/\sqrt{Hz}$ equivalent noise current density at the transimpedance amplifier input. It is extremely difficult to attain these low noise levels, particularly if the wide bandwidths (>6 MHz) required for fiber optic rotation sensors are maintained.

SUMMARY OF THE INVENTION

The present invention provides an improved amplifier topology that has operational characteristics suitable for use in receiving signals output from a fiber optic rotation sensor and producing voltages that may be processed to determine the rotation rate.

An optical receiver according to the present invention comprises a photodiode for receiving an optical signal and producing a photodiode output signal in the form of an electrical current that is indicative of the intensity of the optical signal. The receiver further includes an ultra low noise and ultra low capacitance differential input stage connected to receive the photodiode output signal. An operational amplifier having low noise and ultra-wide bandwidth is connected to the ultra low capacitance differential input stage to receive the output signal therefrom as a driving signal and to produce a low noise output signal.

The ultra low capacitance differential input stage comprises a first amplifier circuit that includes a first transistor connected to the photodetector to act as a first buffer having low noise, low capacitance and unity gain. The first amplifier circuit also includes a second transistor configured as a first voltage follower connected between the output of the first buffer and the operational amplifier to isolate the output of the first buffer from parasitic capacitive loading from a biasing network. The ultra low capacitance differential input stage further comprises a second a second amplifier circuit that includes a third transistor having an input connected to a reference potential, the third transistor acting as a second buffer having low noise, low capacitance and unity gain. The second amplifier circuit also includes a fourth transistor configured as a second voltage follower connected between the output of the second buffer and the operational amplifier.

The optical receiver according to the present invention may further include a first resistor connected to the output of the first buffer and a second resistor connected to the output of the second buffer to isolate the first and second buffers, respectively, from parasitic capacitive loading.

The first amplifier circuit preferably includes a first JFET. The photodiode is connected between the gate and source of the first JFET. The anode of the photodiode (connected to the gate of the first JFET) is connected to the transimpedance resistor. Because the gate impedance is very high, the photocurrent generated by the diode is almost exclusively routed through the transimpedance resistor, thereby generating a voltage proportional to the photocurrent. A first bipolar junction transistor is connected to the source of the first JFET. The emitter of the first bipolar junction transistor is connected to a first input of the operational amplifier. The second amplifier circuit comprises a second JFET and a second bipolar junction transistor. The collector of the second bipolar junction transistor is connected to the collector of the first bipolar junction transistor, and the emitter of the second bipolar junction transistor is connected to a second input of the operational amplifier. The output of the operational amplifier is connected to the other end of the transimpedance resistor, thereby closing the transimpedance loop.

The optical receiver according to the present invention may further include an optional resistor connected to the source of the first JFET to isolate the source of the JFET from parasitic capacitive loading.

The optical receiver according to the present invention may further include an RC network connected between an input and the output of the operational amplifier to provide a lead-lag network in the open loop gains.

The optical receiver according to the present invention preferably further includes a transimpedance shunt capacitor connected across the transimpedance resistor for providing a well-defined transimpedance bandwidth and for reducing high frequency noise in the output signal.

The optical receiver according to the present invention may further comprise a first low noise, wide band width, low capacitance JFET connected to the photodiode as a follower to receive the photodiode output signal and a low noise, low capacitance first bipolar junction transistor connected as an emitter follower to the first JFET. The present invention may further include a second JFET connected to a second bipolar junction transistor such that the second bipolar junction transistor is connected as an emitter follower to the second JFET. An operational amplifier having low noise and ultra-wide bandwidth is connected to the emitters of the bipolar transistor.

An appreciation of the objectives of the present invention and a more complete understanding of its structure and method of operation may be had by studying the following description of the preferred embodiment and by referring to the accompanying drawings.

DESCRIPTION OF THE PREFERRED EMBODIMENT

Figure 1:
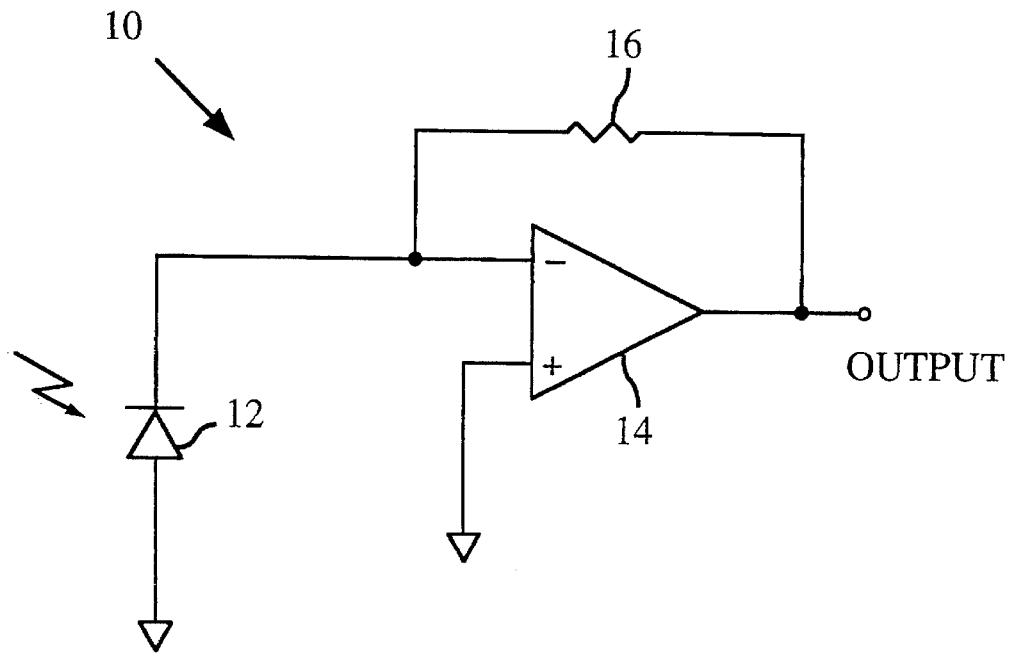
FIG. 1 schematically illustrates an ideal prior art transimpedance amplifier for converting the current output from a photodetector into a voltage usable for subsequent processing to measure Sagnac effect phase shifts between counterpropagating waves in a fiber optic rotation sensor.

Referring to FIG. 1, a typical prior art transimpedance amplifier 10 is connected to a photodiode 12. The photodiode 12 receives an optical signal and produces an electrical current having a magnitude indicative of the incident light intensity. The optical signal may be the output of a fiber optic rotation sensor (not shown), in which two counterpropagating waves are combined so that they interfere. The interference pattern is indicative of phase differences between the counterpropagating waves. The phase difference is directly proportional to the rate of rotation of the fiber optic rotation sensor about its sensing axis.

The transimpedance amplifier 10 includes an operational amplifier 14 and a transimpedance resistor 16. The output of the photodiode 12 is connected to the inverting input of the operational amplifier 14. The non-inverting input of the operational amplifier 14 is connected to ground. The transimpedance resistor 16 is connected across the inverting input and the output of the operational amplifier 14. Ideally no current flows into the inputs of the operational amplifier 14. Thus the entire photocurrent must pass through the transimpedance resistor through which it generates a voltage drop. This voltage drop is measurable at the output of the operational amplifier 14.

The purpose of the transimpedance amplifier is to receive the current output of the photodiode 12 and produce a voltage suitable for subsequent processing. While simple in concept, the closed loop transimpedance amplifier 10 suffers from a number of problems when all the constraints are taken into account. The most important constraints are:

1. The bandwidth must exceed 6 MHz because of the nature of the signals output from a fiber optic rotation sensor;

2. The total equivalent current noise referred to the inverting amplifier input must be below 0.6 pA/$\sqrt{Hz}$ to avoid having an unacceptably high amount of noise that is added to the noise already in the output signal from the fiber optic rotation sensor.

3. The leakage current into the operational amplifier must be controlled to maintain acceptable noise and offset conditions.

4. Available operational amplifiers exhibit significant input capacitance which causes high frequency noise amplification; and 5. Loop stability must be ensured under all conditions.

Figure 2:
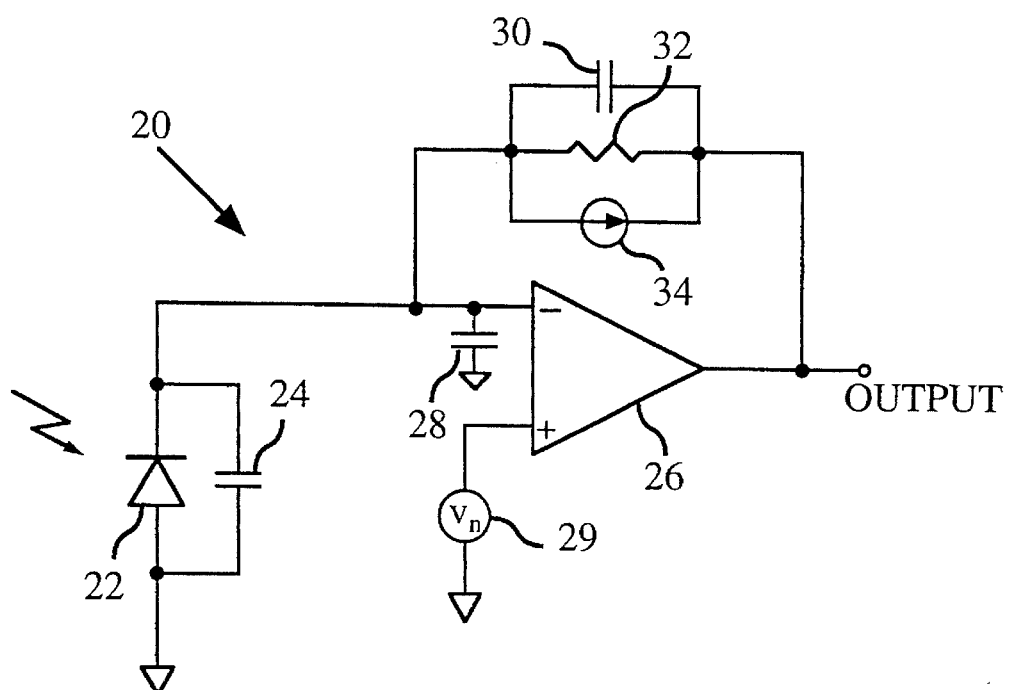
FIG. 2 schematically illustrates a more realistic model of a prior art transimpedance amplifier for processing signals output from a fiber optic rotation sensor.

A more realistic model of the prior art transimpedance amplifier circuit 20 is shown in FIG. 2. A photodiode 22 and a capacitor 24 are shown connected in parallel. The capacitor 24 represents the capacitance of the photodiode. The current output of the photodiode 22 is connected to the inverting input of an operational amplifier 26 and to a transimpedance amplifier 32. A capacitor 28 is connected between the inverting input of the operational amplifier 26 and ground. The capacitor 28 represents the input capacitance of the operational amplifier 26. A source that produces a voltage $V_n$ is connected between the non-inverting input of the operational amplifier 26 and ground. A transimpedance shunt capacitor 30, a transimpedance resistor 32, and a current source 34 are connected in parallel between the inverting input and the output of the operational amplifier 26. The current source 34 represents an error source attributable both to operational amplifier bias and noise and resistor thermal noise.

Because resistors generate thermal noise, the resistance of the transimpedance resistor 32 is constrained. To achieve low current noise, a large resistance value of the transimpedance resistor 32 is required. The thermal noise current density is given by the well-known equation $$i_n = \sqrt{\frac{4kT}{R}}$$

where k≈1.38×10⁻²³ J/°K. is the Boltzmann constant, T is the absolute temperature in °K. and R is the resistance in Ohms. Unfortunately, a large value for the transimpedance resistor 32 causes difficulties with the input capacitance and with stability. The lowest practical value of the transimpedance resistor 32 should therefore be used. It has been found that the best compromise for the circuit of FIG. 2 is to have the resistance of the transimpedance resistor 32 be approximately 150 k$\Omega$. With the best presently-available operational amplifiers, excessive high frequency noise will be generated by the circuit of FIG. 2 because of noise amplification due to the input capacitance 28 and the photodiode capacitance 24. It is difficult to meet the bandwidth and low noise requirements with the high input capacitance of available operational amplifiers.

Figure 3:
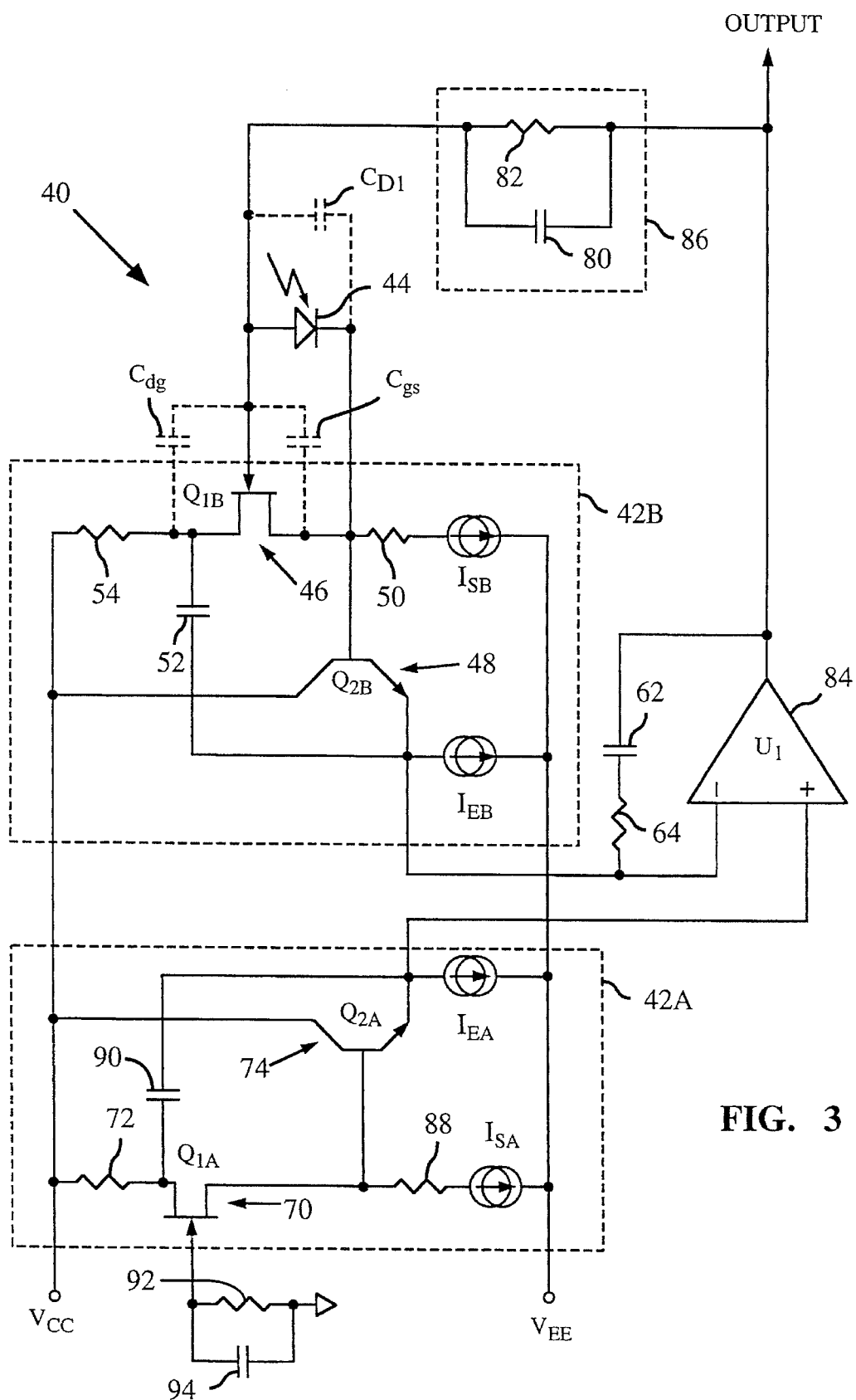
FIG. 3 schematically illustrates a transimpedance amplifier according to the present invention that may be included in a system for processing signals output from a fiber optic rotation sensor.

To solve the problems involved in using the transimpedance amplifier circuits 10 and 20 of FIGS. 1 and 2, respectively, the inventors have developed a new transimpedance amplifier circuit 40, which is shown in FIG. 3. The transimpedance amplifier circuit 40 includes a pair of differential, ultra-low effective capacitance amplifier stages 42A and 42B followed by a low noise, ultra wideband operational amplifier 84.

An optical signal is incident upon a photodetector 44, which produces a current output as described above. The photodetector 44 has its anode connected to the amplifier stage 42B and to the transimpedance network 86 formed by a resistor 82 and shunt capacitor 80. Thus the photodetector 44 is reversed biased. If another type of transistor is used in place of the JFET 46, it may be necessary to reverse the polarity of the connections to the photodetector 44 to keep it in a reverse biased state.

The amplifier stage 42B includes a JFET 46, which is sometimes also referred to as $Q_{1B}$. The JFET 46 is a low noise device with low capacitance, low leakage and a wide bandwidth. The cathode of the photodetector 44 is connected to the source of the JFET 46. The source of the JFET 46 also drives the base of the bipolar junction transistor 48, which is also referred to as $Q_{2B}$. The source of the JFET 46 is additionally connected to a first end of a resistor 50. The other end of the resistor 50 is connected to the first terminal of a current source $I_{SB}$. The other terminal of the current source $I_{SB}$ is connected to a voltage supply $V_{EE}$. The resistor 50 is optional in that its use is only beneficial for certain implementations of the current source. In these cases the resistor 50 serves to isolate the current source capacitance. If the current source $I_{SB}$ is ideal, then the resistor 50 serves no purpose.

A capacitor 52 is connected between the drain of the JFET 46 and the emitter of the bipolar junction transistor 48. The drain of the JFET 46 is supplied from the $V_{CC}$ voltage supply via a resistor 54. The collector of the bipolar junction transistor 48 is directly supplied from the voltage source $V_{CC}$.

The emitter of the bipolar junction transistor 48 is connected to a first terminal of a current source $I_{EB}$. The other terminal of the current source $I_{EB}$ is connected to a voltage $V_{EE}$. The emitter of the bipolar junction transistor 48 is also connected to the inverting input of the operational amplifier 84 and to a resistor 64. The bipolar junction transistor 48 is a low-noise, low capacitance, wide-bandwidth device. The bipolar junction transistor 48 is sometimes referred to herein as $Q_{2B}$. The series combination of the resistor 64 and a capacitor 62 is connected across the inverting input and the output of the operational amplifier 84, which is sometimes referred to as $U_1$.

The amplifier stage 42A configured as shown in FIG. 3 acts purely as a reference circuit that is intended to match the active stage 42B. The circuit 42A preferably includes components that are matched one-to-one with the corresponding components in the circuit 42B. In particular, the JFETS 46 and 70 should be closely matched in their parameters. The bipolar junction transistors 48 and 74 should be matched, and the current sources $I_{SA}$ and $I_{SB}$ should also be closely matched. In this case, the DC potentials at the inputs and outputs of the amplifiers 42A and 42B are equal, which avoids the DC offset and stability problems and offers common mode rejection of power supply variations. It is noted that for other applications, the circuit 42A could be used in active form, thereby providing a true differential amplifier capability.

The amplifier stage 42A includes a JFET 70, which is sometimes referred to as $Q_{1A}$. The JFET $Q_{1A}$, like the JFET $Q_{1B}$, preferably has low noise, low capacitance and wide bandwidth.

In order to provide a zero volt reference for the amplifier circuit, the gate of the JFET 70 is grounded. Optionally, as shown in FIG. 3, a resistor 92 and a capacitor 94 may be connected in parallel between the gate of the JFET 70 and ground. The resistor 92 and capacitor 94 provide a balanced configuration. Practically, the resistor 92 and capacitor 94 may be omitted and the gate of the JFET 70 may be connected directly to ground. The drain of the JFET 70 is connected through a resistor 72 to the voltage source $V_{CC}$. The voltage source $V_{CC}$ is also connected to the collector of a bipolar junction transistor 74. The bipolar junction transistor 74 is sometimes referred to as $Q_{2A}$.

The source of the JFET 70 is connected to the base of the bipolar junction transistor 74 and to a resistor 88 that serves to isolate stray capacitance associated with the current source $I_{SA}$. The other end of the resistor 88 is connected to a first terminal of the current source $I_{SA}$. The other terminal of the current source $I_{SA}$ is connected to the voltage $V_{EE}$. The emitter of the bipolar junction transistor 74 is connected to the non-inverting input of the operational amplifier 84. A current source $I_{EA}$ is connected between the voltage $V_{EE}$ and the emitter of the bipolar junction transistor 74. The emitter of the bipolar junction transistor 74 is also connected to the bootstrap capacitor 90. The other side of the capacitor 90 is connected to the drain of the JFET 70. The resistor 88 and a capacitor 90 balance the two input stages 42A and 42B, which improve power supply rejection and noise characteristics.

The broken lines in FIG. 3 indicate the drain to gate capacitance $C_{dg}$ and the gate to source capacitance $C_{gs}$ of the JFET 46 and the capacitance $C_{D1}$ of the photodetector 44. In the circuit 42B, the JFET 46 is used as a voltage follower. Ideally, the AC voltage at the source of the JFET 46 will exactly track the AC voltage at the gate of the JFET 46. Practically, tracking of better than 95% is obtained at mid-band frequencies. Because of this AC voltage tracking, the AC potential difference between the gate and source of the JFET 46 is greatly attenuated. This prevents substantial AC charging and discharging of the capacitors between the gate and source of the JFET 46. This action is herein referred to as "bootstrapping." Consequently, the capacitors $C_{gs}$ and $C_{D1}$ have little, or greatly reduced, effect on the operation of the circuit which is one of the major advantages of the present invention.

Further, the bipolar junction transistor 48 ($Q_{2B}$) is used as a second voltage follower. In the configuration shown, the emitter of the transistor 48 closely tracks the AC modulation of its base, which is connected to the source of the JFET 46. Thus, the emitter of the transistor 48 tracks the source of the JFET 46, which, in turn, tracks the gate of the JFET 46. The AC voltage at the emitter of the transistor 48 is connected via the capacitor 52 to the drain of the JFET 46. In this way, the AC voltage of the JFET 46 will also closely match the voltage at the gate of the JFET 46, which prevents substantial AC charging and discharging of the capacitor $C_{dg}$. Consequently, the gate to drain capacitance $C_{dg}$ has little, or greatly reduced, effect on the operation of the circuit. Since the operation of the JFET 46 is relatively insensitive to drain voltage variations, the drain bootstrapping described above does not have detrimental effects.

The net effect of the topology of the circuit 42B is to bootstrap input capacitances as described above in order to minimize their impact on circuit operation. The use of the bipolar junction transistors 48 and 74 provides low impedance differential outputs suitable for driving the operational amplifier 84 and bootstrapping capacitors 52 and 90. It is noted that in order to achieve low noise characteristics, the transistors 46, 48, 70 and 74 and the operational amplifier 84 must be low-noise devices.

The transimpedance loop is closed using operational amplifier 84 and the transimpedance element 86 formed by the resistor 82 and the capacitor 80 connected in parallel between the output of the operational amplifier 84 and the anode of the diode 44. Ideally, the high gain of the operational amplifier 84 will equalize the potentials of its inverting and non-inverting inputs. Further, because of the symmetry between circuits 42A and 42B, the potential at the gate of the transistor 46 ($Q_{1B}$) will match the potential at the gate of the transistor 70 ($Q_{1A}$), which in the present case is ground potential. It is also recognized that the impedance of the JFET gate is extremely high. Therefore, current flow from the diode 44 into the JFET 46 is impeded. The photocurrent generated by the diode 44 must flow nearly exclusively through the transimpedance network 86 formed by the transimpedance resistor 82 in parallel with transimpedance capacitor 80. As a result, the voltage drop across the transimpedance network will be substantially proportional to the intensity of light incident upon the diode 44. Because the gate of the JFET 46 is at nearly zero potential (due to reference circuit 42A), and is connected to the anode of the diode 44 and one end of the transimpedance network 86, the voltage drop may be directly measured at the output of operational amplifier 84 connected to the other end of the transimpedance network 86. In this way, the circuit 40 of FIG. 3 forms a closed loop transimpedance amplifier. A feedback compensation network formed by the capacitor 62 and the resistor 64 connected in series between the inverting input of the operational amplifier 84 and the output of the operational amplifier 84 serves to induce a phase lead in the loop at high frequencies in order to stabilize the closed loop. Transimpedance capacitor 80 in parallel with transimpedance resistor 82 serves the purpose of defining the transimpedance bandwidth and providing additional phase lead.

The transimpedance amplifier circuit 40 has several advantages over the prior art.

1. The circuit provides an ultra-low effective input capacitance. The diode 44 is naturally reversed biased in the circuit, thereby reducing its inherent capacitance $C_{D1}$. The use of the low noise, low capacitance wide bandwidth JFETS $Q_{1A}$ and $Q_{1B}$ as followers has the additional advantage of bootstrapping the gate to source capacitance and the diode capacitance to effective low values. The AC bootstrapping provided by the transistor $Q_{2B}$ and the capacitor 52 reduces the effective drain to gate capacitance to a negligible value.

As a result of this topology, the true input capacitance of several pF can be reduced to an effective value that is below 1 pF. This effective input capacitance is nearly an order of magnitude lower than in conventional silicon technology circuits.

2. The differentially symmetric topology of the transimpedance amplifier circuit 40 provides stable DC operation and rejection of power supply noise.

3. The high gain, ultra wideband operational amplifier $U_1$ provides several advantages in the transimpedance amplifier circuit 40. For example, the high open loop gain of the operational amplifier $U_1$ ensures linearity and fast settling characteristics.

The operational amplifier $U_1$ has a high gain-bandwidth product, which permits the transimpedance bandwidth to be exclusively determined by the RC network that includes the resistor 80 and the capacitor 82. This is achieved by ensuring that the frequency at which the open loop gain drops below unity occurs well above the transimpedance bandwidth.

Other features of the transimpedance amplifier 40 circuit include the resistor 50 which isolates the source of $Q_{1B}$ from parasitic capacitive loading in the case of a non-ideal current source. The RC network, comprised of the resistor 64 and the capacitor 62, around the operational amplifier 84 serves as a lead-lag network in the open loop gain, which improves phase margin and allows for a more robust, fast settling (no ringing) closed loop operation. The transimpedance shunt capacitance 80 serves not only to determine the transimpedance bandwidth (values in excess of 10 MHz possible) but also to inject a phase lead in the open loop gain. The capacitor 80 also rolls off high frequency noise.

Typical values used in a preferred embodiment of the invention are:

Vcc=10 V–15 V
$V_{EE}$=–5 V
$Q_1$=Interfet NJ14 or equivalent
$Q_2$=Harris HFA3127 or 2N6604
$U_1$=Comlinear CL425
$I_{SA}=I_{SB}$=1 mA
$I_{EA}=I_{EB}$=1 mA
Capacitors 52 and 90=0.039 μF
Resistors 54 and 72=2 kΩ
Resistors 50 and 88=1.5 kΩ
Resistors 82 and 92=150 kΩ
Capacitors 80 and 94=0.15 pF
Resistor 64=800 Ω
Capacitor 62=10 pF The structures and methods disclosed herein illustrate the principles of the present invention. The invention may be embodied in other specific forms without departing from its spirit or essential characteristics. The described embodiments are to be considered in all respects as exemplary and illustrative rather than restrictive. In particular, the description of the preferred embodiment of the invention of FIG. 3 refers to specific types of transistors. Other types of transistors may be substituted for the bipolar junction transistors and the JFETS. Any transistor may be substituted for the components described if the basic requirements of gain, bandwidth, bias current, noise, impedance and capacitance are satisfied. There are new types of vacuum tubes that could be used in forming the circuit of FIG. 3.

Therefore, the appended claims rather than the foregoing description define the scope of the invention. All modifications to the embodiments described herein that come within the meaning and range of equivalence of the claims are embraced within the scope of the invention.

What is claimed is:

1. An optical receiver for receiving an incident optical signal and producing an electrical signal indicative of the optical signal intensity, comprising:

a photodetector for receiving the optical signal and producing a photodetector output signal that is indicative of the intensity of the optical signal;

an ultra low capacitance differential input stage connected to receive the photodetector output signal and producing a buffer output signal; and an operational amplifier having low noise and ultra-wide bandwidth connected to the ultra low capacitance differential input stage to receive the buffer output signal therefrom as a driving signal, the low noise ultra-wide bandwidth operational amplifier producing a low noise output signal;

the ultra low capacitance differential input stage comprising:
   a first amplifier circuit comprising:
      a first transistor connected to and being bootstrapped by the photodetector, the first transistor acting as a first gain buffer having low noise, low capacitance and unity gain;
      a second transistor configured as a first voltage follower connected between the output of the first buffer and the operational amplifier to isolate the output of the first buffer from parasitic capacitive loading from a biasing network;
   a second amplifier circuit comprising:
      a third transistor having an input connected to a reference potential, the third transistor acting as a second gain buffer having low noise, low capacitance and unity gain; and
      a fourth transistor configured as a second voltage follower connected between the output of the second buffer and the operational amplifier.

2. The optical receiver of claim 1, further including a first resistor connected to the output of the first buffer and a second resistor connected to the output of the second buffer to isolate the first and second buffers, respectively, from parasitic capacitive loading.

3. The optical receiver of claim 1, further including an RC network connected between an input and the output of the operational amplifier to provide a lead-lag network in the open loop gains.

4. The optical receiver of claim 1, further comprising a transimpedance network connected between the output of the operational amplifier and a terminal of the photodetector for generating a high transimpedance bandwidth and for reducing high frequency noise in the output signal.

5. The optical receiver of claim 1, further including a first bootstrapping capacitor connected between an input of the first buffer and the output of the first voltage follower and a second bootstrapping capacitor connected between the input of the second buffer and the output of the second voltage follower.

6. The optical receiver of claim 1 wherein the first and third transistors are JFETS.

7. The optical receiver of claim 1 wherein the second and fourth transistors are bipolar junction transistors.

8. The optical receiver of claim 1, wherein:

the first transistor comprises a first JFET having a gate, a source and a drain, the photodetector being connected between the gate and source of the first JFET;

the second transistor comprises a first bipolar junction transistor having an emitter, a collector and a base, the base of the first bipolar junction transistor being connected to the source of the first JFET and to the photodetector, the emitter of the first bipolar junction transistor being connected to a first input of the operational amplifier;

the third transistor comprises a second JFET having a gate, a source and a drain; and the fourth transistor comprises a second bipolar junction transistor having an emitter, a collector and a base, the collector of the second bipolar junction transistor being connected to the collector of the first bipolar junction transistor, the emitter of the second bipolar junction transistor being connected to a second input of the operational amplifier, and the base of the second bipolar junction transistor being connected to the source of the second JFET.

9. The optical receiver of claim 8, further including a first resistor connected to the output of the first buffer and a second resistor connected to the output of the second buffer to isolate the first and second buffers, respectively, from parasitic capacitive loading.

10. The optical receiver of claim 8, further including an RC network connected between an input and the output of the operational amplifier to provide a lead-lag network in the open loop gains.

11. The optical receiver of claim 8, further comprising a transimpedance network connected between the output of the operational amplifier and the anode of the photodiode for generating a high transimpedance bandwidth and for reducing high frequency noise in the output signal.

12. The optical receiver of claim 8, further including a first bootstrapping capacitor connected between the drain of the first JFET and the emitter of the first bipolar junction transistor and a second bootstrapping capacitor connected between the drain of the second JFET and the emitter of the second bipolar junction transistor.

13. An optical receiver for receiving an incident optical signal and producing an electrical signal indicative of the optical signal intensity, comprising:

a photodetector for receiving the optical signal and producing a photodetector output signal that is indicative of the intensity of the optical signal;

a first low noise, wide band width, low capacitance JFET connected by the gate and source thereof to the photodetector as a follower to receive the photodetector output signal;

a first low noise, low capacitance bipolar junction transistor connected as an emitter follower to the first JFET;

a second low noise, wide bandwidth, low capacitance JFET connected as a reference follower;

a second low noise, low capacitance bipolar transistor connected to the second JFET such that the second bipolar junction transistor is connected as an emitter follower to the second JFET; and an operational amplifier having low noise and ultra-wide bandwidth connected to the emitters of the bipolar junction transistor.

14. A method for forming an ultra-low noise optical receiver for receiving an incident optical signal and producing an electrical signal indicative of the optical signal intensity, comprising the steps of:

arranging a photodetector to receive the optical signal and produce a photodetector output signal that is indicative of the intensity of the optical signal;

forming an ultra low capacitance differential input stage to receive the photodetector output signal and to produce a buffer output signal; and connecting an operational amplifier having low noise and ultra-wide bandwidth to the ultra low capacitance differential input stage to receive the buffer output signal therefrom as a driving signal and produce a low noise output signal;

the step of forming the ultra low capacitance differential input stage comprises the steps of:

forming a first amplifier circuit by the steps of:

connecting a first transistor in a bootstrap relationship to the photodetector such that the first transistor acting as a first buffer having low noise, low capacitance and unity gain;

connecting a second transistor configured as a first voltage follower between the output of the first buffer and the operational amplifier to isolate the output of the first buffer from loading of at least the operational amplifier;

forming a second amplifier circuit by the steps of:

connecting a third transistor to a reference potential, the third transistor acting as a second buffer having low noise, low capacitance and unity gain; and connecting a fourth transistor configured as a second voltage follower between the output of the second buffer and the operational amplifier.

15. The method of claim 14, further including the steps of;

connecting a first resistor to the output of the first buffer; and connecting a second resistor connected to the output of the second buffer to isolate the first and second buffers, respectively, from parasitic capacitive loading.

16. The method of claim 14, further including the step of connecting an RC network between an input and the output of the operational amplifier to provide a lead-lag network in the open loop gains.

17. The method of claim 14, further comprising the step of connecting a transimpedance network between the output of the operational amplifier and a terminal of the photodetector for generating a high transimpedance bandwidth and for reducing high frequency noise in the output signal.

18. The method of claim 14, further including the steps of:

connecting a first bootstrapping capacitor between an input of the first buffer and the output of the first voltage follower; and connecting a second bootstrapping capacitor connected between the input of the second buffer and the output of the second voltage follower.

19. The method of claim 14, wherein:

the step of connecting a first transistor comprises the step of connecting a first JFET having a gate connected to a terminal of the photodetector, a source connected to another terminal of the photodetector, and a drain;

the step of connecting a second transistor comprises the step of connecting a first bipolar junction transistor having an emitter, a collector and a base, the base of the first bipolar junction transistor being connected to the source of the first JFET and to the photodetector, the emitter of the first bipolar junction transistor being connected to a first input of the operational amplifier;

the step of connecting a third transistor comprises the step of connecting a second JFET having a gate, a source and a drain connected to a reference voltage;

the step of connecting a fourth transistor comprises the step of connecting a second bipolar junction transistor having an emitter, a collector and a base, the collector of the second bipolar junction transistor being connected to the collector of the first bipolar junction transistor, the emitter of the second bipolar junction transistor being connected to the second input of the operational amplifier, and the base of the second bipolar junction transistor being connected to the source of the second JFET.

* * * * *